US008314676B1

(12) United States Patent
Smeys et al.

(10) Patent No.: US 8,314,676 B1
(45) Date of Patent: Nov. 20, 2012

(54) METHOD OF MAKING A CONTROLLED SEAM LAMINATED MAGNETIC CORE FOR HIGH FREQUENCY ON-CHIP POWER INDUCTORS

(75) Inventors: Peter Smeys, San Jose, CA (US); Andrei Papou, San Jose, CA (US); Peter Johnson, Sunnyvale, CA (US); Anuraag Mohan, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/098,656

(22) Filed: May 2, 2011

(51) Int. Cl.
*H01F 5/00* (2006.01)
*H01F 7/06* (2006.01)
*H01L 27/08* (2006.01)

(52) U.S. Cl. ........................ 336/200; 257/531; 29/602.1

(58) Field of Classification Search .................. 336/200, 336/223, 232, 205, 206, 219, 221; 257/531; 29/602.1
See application file for complete search history.

(56) References Cited

U.S. PATENT DOCUMENTS 6,452,247 B1 * 9/2002 Gardner ........................ 257/528
7,061,359 B2 * 6/2006 Ding et al. .................... 336/200
7,271,693 B2 * 9/2007 Ding et al. .................... 336/200
7,480,980 B2 * 1/2009 Jung et al. .................... 29/602.1
7,564,319 B2 * 7/2009 Ding et al. .................... 331/181
7,584,533 B2 * 9/2009 Smeys et al. .................... 29/604
7,755,463 B2 * 7/2010 Hopper et al. ................ 336/200
7,875,955 B1 * 1/2011 Hopper et al. ................ 257/531
7,936,246 B2 * 5/2011 Hopper et al. ................ 336/212
8,042,260 B2 * 10/2011 Hopper et al. .................. 29/606
8,079,134 B2 * 12/2011 Maki et al. ................... 29/602.1
8,102,236 B1 * 1/2012 Fontana et al. ............... 336/200

* cited by examiner

*Primary Examiner* — Mohamad Musleh
*Assistant Examiner* — Joselito Baisa
(74) *Attorney, Agent, or Firm* — Eugene C. Conser; Wade J. Brady, III; Frederick J. Telecky, Jr.

(57) ABSTRACT

A controlled seam magnetic core lamination utilizable in an inductor structure includes a magnetic base and first and second spaced-apart magnetic sidewalls extending substantially orthogonally from the base to define a seam therebetween. The controlled seam magnetic core lamination is utilizable in an inductor structure that includes: a non-conductive lower mold; a plurality of spaced-apart controlled seam lower laminations formed in the lower mold, each magnetic lower lamination having a horizontal base and first and second spaced-apart sidewalls extending substantially vertically upward from the base to define a seam therebetween; a non-conductive isolation layer formed on the lower mold and the magnetic lower laminations; a conductive trace formed on the isolation layer; a non-conductive upper mold formed over the isolation layer and the conductive trace; and a plurality of spaced-apart controlled seam magnetic upper laminations formed in the upper mold, each magnetic upper lamination having a horizontal base and first and second spaced-apart sidewalls that extend substantially vertically upward from the base to define a seam therebetween.

9 Claims, 16 Drawing Sheets

METHOD OF MAKING A CONTROLLED SEAM LAMINATED MAGNETIC CORE FOR HIGH FREQUENCY ON-CHIP POWER INDUCTORS

RELATED APPLICATION

This application is related to co-pending and commonly-assigned application Ser. No. 12/082,209, filed on Apr. 9, 2008, and published on Oct. 15, 2009, as Publication No. U.S. 2009/0256667 A1. Application Ser. No. 12/082,209 is hereby incorporated by reference herein in its entirety.

FIELD OF THE INVENTION

The present invention relates to on-chip power inductor structures and to methods of making a controlled seam laminated magnetic core for high frequency on-chip power inductors.

BACKGROUND OF THE INVENTION

Laminating a magnetic core is a well know technique that reduces the adverse effect of eddy currents on the performance of inductors and transformers. While being relatively straightforward to implement in the macro world, fabricating laminations presents challenges in the case of micro-fabricated and on-chip inductor structures.

One of the approaches to fabricating on-chip inductors is to deposit laminations horizontally, layer by layer, separated by thin dielectric films. Those skilled in the art will appreciate that this approach requires multiple deposition steps to build sufficient volume of magnetic material, which makes this approach prohibitively expensive. Therefore, all practical solutions of this type to date are limited to one or two laminations. See, for example, S. C. O. Mathuna et al., "Magnetics on Silicon: An Enabling Technology for Power Supply on Chip," IEEE Transactions on Power Electronics, Vol. 20, No. 3, May 2005, pp. 585-592. In this case, the performance of the inductor is limited because of the low total amount of magnetic material.

Alternatively, laminations can be built vertically utilizing photolithography. These solutions are known for very thin film inductors that do not receive practical exposure for the same reasons set forth above with respect to the horizontal lamination approach. See, for example, D. S. Gardner et al., "Integrated On-Chip Inductors With Magnetic Films," IEEE Transactions on Magnetics, Vol. 43, No. 6, June 2007. pp. 2615-2617.

Another type of known micro-fabricated inductor utilizes vertical laminations that are large (i.e., hundreds of microns in cross-section), which does little to help reduce eddy currents. See, for example, P. Galle et al., "Ultra-Compact Power Conversion Based on a CMOPS-Compatible Microfabricated Power Inductor with Minimized Core Losses," 2007 Electronic Components Technology Conference, pp. 1889-1894. In addition, inductors of this type are prohibitively large.

Commonly-assigned and co-pending U.S. patent application Ser. No. 12/082,209, filed on Apr. 9, 2008, by Smeys et al., and titled "MEMS Power Inductor and Method of Forming the MEMS Power Inductor," discloses a scalable MEMS inductor formed on the top surface of a semiconductor die. The disclosed thick film magnetic inductors have vertically designed laminations that are built inside thick photoresistive films, thereby providing large volumes of magnetic material while the cross-sectional dimension of about 10 μm helps to make this high performance device within a few square millimeters. The aspect ratio of the lamination cross-section is in the range of 3:1 to 4:1, which reduces eddy currents. (See also, U.S. Pat. No. 7,705,411, which issued to Smeys et al. on Apr. 27, 2010, and is hereby incorporated by reference herein in its entirety to provide background information regarding the present invention.)

DETAILED DESCRIPTION OF THE INVENTION

Figure 1:
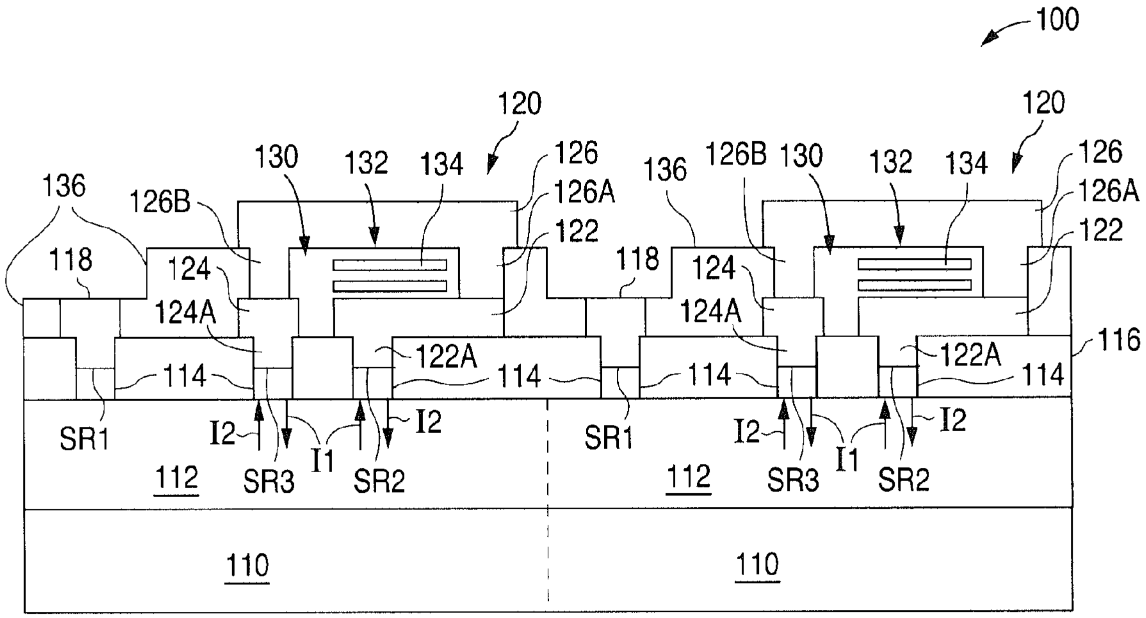
FIG. 1 (PRIOR ART)
FIG. 1 is a cross-sectional drawing illustrating a prior art semiconductor wafer that includes analog circuits and MEMS inductors.

FIG. 1 shows a cross-sectional view that illustrates an example of a prior art semiconductor wafer 100 that includes analog circuits and micro-electromechanical system (MEMS) inductors. As shown in FIG. 1, semiconductor wafer 100 includes a number of identical die-sized substrate regions 110, and a corresponding number of identical metal interconnect structures 112 that are connected to the substrate regions 110.

Each substrate region 110 includes a number of structures, such as resistors, transistors, capacitors, diodes and similar active devices, which are formed in and on the substrate region 110. Each metal interconnect structure 112, in turn, is a multi-layered structure that electrically interconnects the various devices that are formed in or on the substrate region 110 to realize an integrated electrical circuit.

As further shown in FIG. 1, the top section of each metal interconnect structure 112 includes a number of conductive structures 114, such as aluminum traces, and a layer of passivation material 116, such as silicon nitride, silicon oxide, or a combination of the two, that touches and isolates the conductive structures 114.

In addition, a number of opening are formed in the layer of passivation material 116 to expose selected regions SR1 on the top surfaces of the conductive structures 114 in each metal interconnect structure 112. The selected regions SR1, in turn, form connection points for a copper-topped structure. (Only one selected region SR1 is shown for clarity.)

Further, openings are also formed in the layer of passivation material 116 to expose selected regions SR2 and SR3 on the top surfaces of the conductive structures 114 in each metal interconnect structure 112. The selected regions SR2 and SR3 form first and second connection points for a MEMS inductor, described in detail below.

Semiconductor wafer 100 also includes a number of identical copper-topped structures 118 and a number of identical copper MEMS inductors 120 that are formed on the metal interconnect structures 112. Each copper-topped structure 118, which includes vias, traces and pads, touches the passivation layer 116 and the selected regions SR1 of a metal interconnect structure 112. In operation, each copper-topped structure 118 provides signal and power routing, and external electrical connection points for an integrated circuit. Thus, once packaged, bonding wires can be connected to the pad regions of each copper-topped structure 118.

Each copper MEMS inductor 120, in turn includes a conductive base plate 122 with a via extension 122A that touches the passivation layer 116 and the selected region SR2 of a metal interconnect structure 112, and a conductive plug 124 with a via extension 124A that touches the passivation layer 116 and the selected region SR3 of a metal interconnect structure 112.

Each MEMS inductor 120 further includes a top conductive plate 126 that lies over the base conductive plate 122. In the illustrated example, the widths and thicknesses of the plates 122 and 126 are substantially identical. Each top conductive plate 126 has a first via extension 126A that touches a base conductive plate 122 of a metal interconnect structure 112, and a second via extension 126B that touches a conductive plug 124 of a metal interconnect structure 112. In addition, base conductive plate 122, top conductive plate 126, and the via extensions 126A and 126B, define an enclosed region 130 that lies only between the base and top conductive plates 122 and 126, and the via extensions 126A and 126B.

In the FIG. 1 example, each MEMS inductor 120 also includes a magnetic core structure 132 that is located within enclosed region 130. Magnetic core structure 132, which is electrically isolated from all other conductive regions, can be implemented, for example, with a number of laminated permalloy (Ni—Fe) cores 134, as described in U.S. Pat. No. 7,250,842, issued on Jul. 31, 2007, to Peter Johnson et al., which is hereby incorporated by reference herein in its entirety. The thickness of the laminations must be thin enough to minimize eddy currents.

As further shown in FIG. 1, semiconductor wafer 100 additionally includes an isolation film 136 that touches passivation layer 116, the copper-topped structures 118, and the copper MEMS inductors 120. Isolation film 136 can be implemented utilizing, for example, an oxide or benzocyclobutene (BCB).

In operation, a current I1 can flow into a MEMS inductor 120 through base conductive plate 122 by way of via extension 122A and selected region SR2, and flow out of conductive plug 124 via selected region SR3. A current I2 can also flow in the opposite direction, flowing into MEMS inductor 120 through conductive plug 124 by way of selected region SR3, and out along via extension 122A of base conductive plate 122 and selected region SR2. A current flowing through an inductor generates a magnetic field that produces a magnetic flux density. The magnetic flux density, in turn, is a measure of the total magnetic effect that is produced by the current flowing through the inductor.

One problem with the formation of a MEMS inductor is that it is difficult to form a MEMS inductor that is scalable to frequencies of operation that are greater than 10 MHz at currents that are greater than a few 100 mA.

Figure 2A:
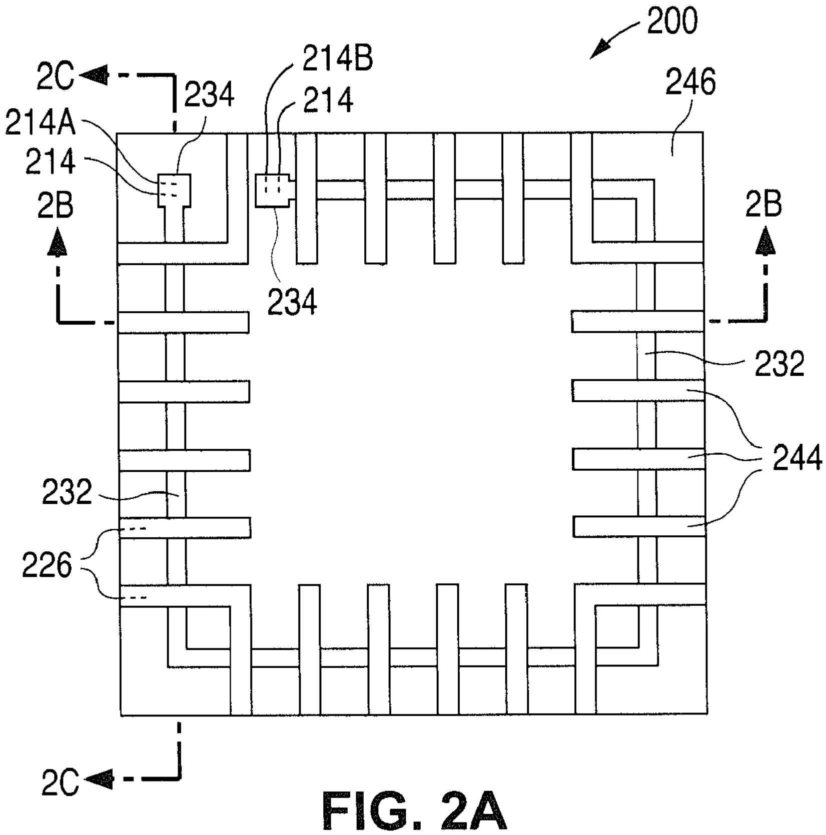
FIGS. 2A-2C are views illustrating an embodiment of a semiconductor wafer that includes analog circuits and MEMS inductors in accordance with the concepts of the present invention.
Figure 2B:
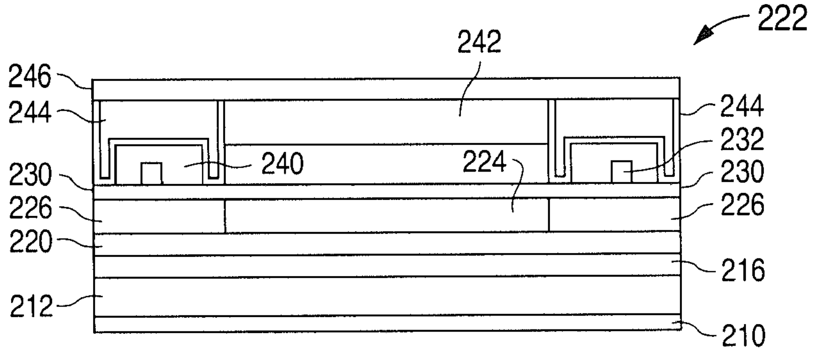
Figure 2C:
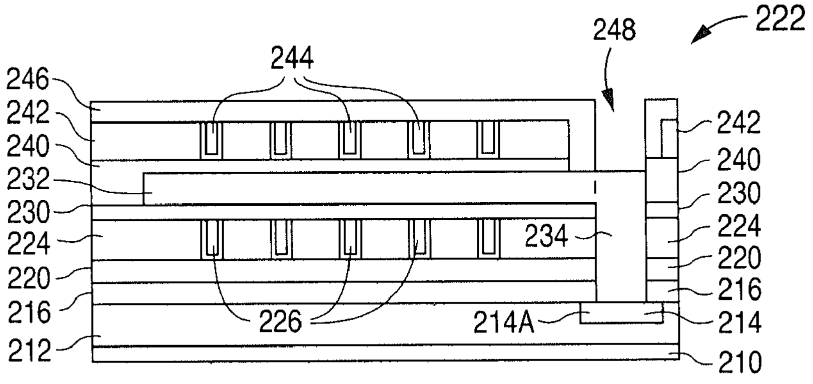

FIGS. 2A-2C show views that illustrate an example of a semiconductor wafer 200 that includes analog circuits and MEMS inductors in accordance with the present invention. As described in greater detail below, the present invention provides methodology that forms a scalable MEMS inductor on the top surface of the semiconductor die. As discussed in detail below, the MEMS inductor includes a number of controlled seam magnetic lower laminations, a circular trace that lies directly over the magnetic lower laminations, and a number of controlled seam magnetic upper laminations that lie directly over the circular trace.

As shown in FIGS. 2A-2C, semiconductor wafer 200 includes a number of identical die-sized substrate regions 210, and a corresponding number of identical metal interconnect structures 212 that are connected to the substrate regions 210. (Only one die-sized region 210 and one metal interconnect structure 212 are shown for simplicity.) Each substrate region 210 includes a number of structures, such as resistors, transistors, capacitors, diodes, and similar devices that are formed in and on the substrate region 210. Each metal interconnect structure 212, in turn, is a multilayer structure that electrically interconnects together the various devices that are formed in a substrate 210 to realize an integrated electrical circuit.

In addition, the top section of each metal interconnect structure 212 includes a number of conductive structures 214, such as aluminum traces, and a layer of passivation material 216, such as silicon nitride, silicon oxide, or a combination of the two, that touches and isolates the conductive structures 214. The conductive structures 214, in turn, include a pair of MEMS-supporting conductive structures 214A and 214B, For example, the pair of MEMS-supporting conductive structures 214A and 214B can represent the input and the output nodes of a MEMS inductor.

Further, in the illustrated embodiment, semiconductor wafer 200 includes a stress relief layer 220 that lies on passivation layer 216. Stress relief layer 220 is able to laterally deform enough to absorb dimensional changes from the materials used to form a MEMS inductor, and prevent stress from being transmitted to the underlying metal interconnect structures 212 and substrate regions 210.

Stress relief layer 220 is implemented with a material that has a maximum bulk elongation that is substantially greater than the maximum bulk elongation of the material used to form passivation layer 216, such as silicon oxide and silicon nitride, and the maximum bulk elongation of the material used to form the MEMS devices such as oxide, SU-8 epoxy, permalloy and copper. Bulk elongation is a well-known measure of the amount a structure can stretch before it breaks.

For example, stress relief layer 220 can be implemented with a spin-on benzocyclobutene (BCB) or photoimagible elastomer, such as photoimagible silicone WL-5150 manufactured by Dow Corning®. The adhesion properties of these two materials are excellent, and provide a suitable base layer for subsequent MEMS processing.

BCB has a maximum bulk elongation of approximately 8%, while the Dow Corning material has a maximum bulk elongation of approximately 30%. Alternately, other formulations of isolating films with large maximum bulk elongation values would work equally as well. By contrast, silicon oxide and silicon nitride have a very small maximum bulk elongation of, for example, 2%. Similarly, copper, permalloy, silicon dioxide and SU-8 epoxy have a very small maximum bulk elongation of, for example, 2%. Thus, the maximum bulk elongation of the stress relief layer 220 is substantially greater than the maximum bulk elongations of passivation layer 216 and the materials that are used to form a MEMS device, ranging from 4× to 15× greater.

In addition, stress relief layer 220 can also be implemented with a material that can be fully cured (hardened) at a temperature, such as 250° C., that is greater than the highest subsequent processing temperature. Curing the stress relief layer 220 at a temperature that is higher than the highest subsequent process temperature ensures stability of the film.

As shown in FIGS. 2A-2C, semiconductor wafer 200 also includes a MEMS inductor 222 that lies on stress relief layer 220 and is electrically connected to a pair of MEMS-supporting conductive structures 214A and 214B. MEMS inductor 222 includes a non-conducting lower mold 224 that touches stress relief layer 220, and a number of controlled seam magnetic lower laminations 226 that are formed in the lower mold 224 over each metal interconnect structure 212.

In the illustrated embodiment, the lower mold 224 is implemented utilizing SU-8 which, as noted above, has a very low maximum bulk elongation when compared to the maximum bulk elongation of stress relief layer 220. In addition, the controlled seam magnetic core lower laminations, which function as a lower magnetic core structure, can be implemented with, for example, laminated permalloy (Ni—Fe) or other magnetic materials, as discussed in greater detail below. The thickness of the laminations must be thin enough to minimize eddy currents. Further, the controlled magnetic lower laminations 226 are totally electrically isolated from each other and from all other conductive structures.

In addition, MEMS inductor 222 includes a nonconductive isolation layer, for example, a magnetic gap dielectric layer 230, that is formed on mold 224 and the controlled seam magnetic lower laminations 226. The magnetic gap dielectric layer 230 can be implemented utilizing, for example, SU-8 epoxy. Lower mold 224 and magnetic gap isolation layer 230 electrically isolate each of the controlled seam magnetic lower laminations 226.

MEMS inductor 222 further includes a (square) circular copper trace 232 that touches the magnetic gap isolation layer 230 and a pair of copper plugs 234 that touch the pair MEMS-supporting conductive structures 214A and 214B. Copper trace 232, which lies directly over each of the controlled seam magnetic lower laminations 226, ids illustrated in FIGS. 2A-2B as having a single loop, although one skilled in the art will appreciate that copper trace 232 can alternately be formed to have multiple loops.

As further shown in FIGS. 2A-2C, MEMS inductor 222 includes a non-conducting base mold 240 that is formed on the magnetic gap isolation layer 230 and circular copper trace 232, and a non-conducting cap mold 242 that is formed on base mold 240. The base and cap molds 240 and 242, which form a single upper mold, can be implemented utilizing, for example, SU-8 epoxy.

In addition, MEMS inductor 222 includes a number of controlled seam magnetic upper laminations 244 that touch molds 240 and 242 (the upper mold) directly over each metal interconnect structure 212. The controlled seam magnetic upper laminations, which function as an upper magnetic core structure, can be implemented utilizing, for example, laminated permalloy (Ni—Fe) or other magnetic materials, as discussed in greater detail below. The thickness of the laminations must be thin enough to minimize eddy currents. Further, the magnetic upper laminations 244 are totally electrically isolated from each other and from all other conductive structures.

As shown in FIGS. 2A-2C, each controlled seam magnetic upper lamination 244, which lies directly over copper trace 232, has vias that extend down so that each magnetic upper lamination 244 lies along three cross-sectional sides of copper trace 232, while a corresponding lower lamination 226 extends along the fourth cross-sectional side of copper trace 232.

MEMS inductor 222 also includes a passivation layer 246 that is formed on mold 242 and the controlled seam magnetic upper laminations 244. Molds 240 and 242 (the upper mold) and passivation layer 246 electrically isolate each of the controlled seam magnetic upper laminations 244. Passivation layer 246 can be implemented utilizing, for example, benzocyclobutene (BCB). In addition, openings 248 are formed in passivation layer 246 to expose the copper plugs 234.

Thus, in the illustrated embodiment, wafer bow is prevented by utilizing a stress relief layer 220 that laterally deforms enough to absorb dimensional changes from the materials that are used to form the MEMS inductors, and thereby prevents stress from being transmitted to the underlying metal interconnect structures 212 and substrate regions 210.

FIGS. 3A-3C through 14A-14C show views that illustrate an embodiment of a method of forming an integrated circuit with a MEMS inductor that utilizes controlled seam magnetic core laminations in accordance with the concepts of the present invention. FIGS. 3A-14A show plan views, while FIGS. 3B-14B show cross-sectional views taken along line 3B-3B through line 14B-14B of FIGS. 3A-14A, respectively, and FIGS. 3C-14C show cross-sectional views taken along line 3C-3C through line 14C-14C of FIGS. 3A-14A, respectively.

Figure 3A:
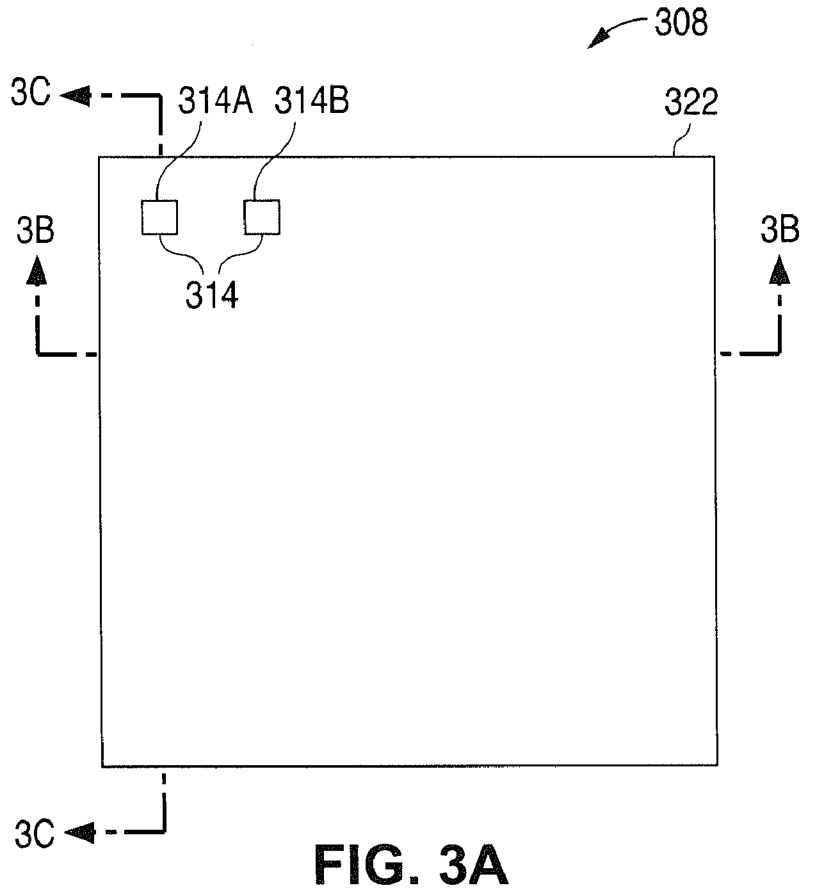
FIGS. 3A-3C through 14A-14C are views illustrating embodiments of methods of forming an integrated circuit that includes a MEMS inductor in accordance with the concepts of the present invention.
Figure 3B:
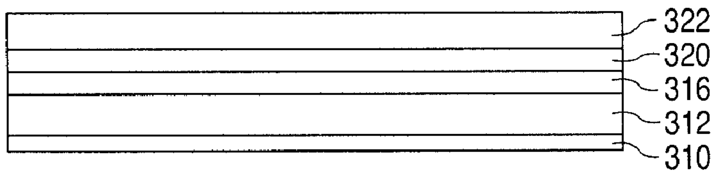
Figure 3C:
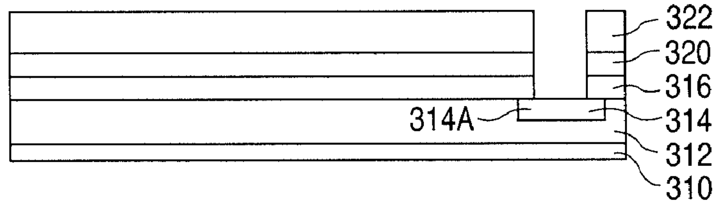

As shown in FIGS. 3A-3C, the method utilizes a conventionally-formed semiconductor wafer 308 that includes a number of identical die-sized substrate regions 310, and a corresponding number of identical metal interconnect structures 312 that are connected to the substrate regions 310. (Only one die-sized region 310 and one metal interconnect structure 312 are shown for simplicity.).

Each substrate region 310 includes a number of structures, such as resistors, transistors, capacitors, diodes and similar devices, which are formed in and on the substrate region 310. Each metal interconnect structure 312, in turn, is a multi-layered structure that electrically interconnects the various devices that are formed in a substrate region 310 to realize an integrated electrical circuit.

As further shown in FIGS. 3A-3C, the top section of each metal interconnect structure 312 includes a number of conductive structures 314, such as aluminum traces and bond pads, a layer of passivation material 316, such as silicon nitride, silicon oxide, or a combination of the two, that touches and isolates the conductive structures 314.

The method begins by forming a stress relief layer 320 on the top surface of the passivation layer 316. In the illustrated embodiment, stress relief layer 320 is implemented with a material that has a maximum bulk elongation that is substantially greater than the maximum bulk elongation of the material used to form passivation layer 316. For example, a 5 μm thick film of BCB or WL-5150 on top of passivation layer 316 can effectively absorb the lateral stress from a MEMS structure (e.g., SU-8/copper/permalloy) which has thickness of 5-100 μm. In addition, stress relief layer 320 can be implemented with a material that can be cured at a temperature that is higher than the highest subsequent process temperature.

Referring back to FIGS. 3A-3C, once stress relief layer 320 has been formed, a mask 322 is formed and patterned on stress relief layer 320. Following formation of the mask 322, the exposed regions of the stress relief layer 320 are etched to expose a pair of conductive structures 314A and 314B in each metal interconnect structure 312 that corresponds 312 that corresponds with the input and output of an inductor. (Other conductive structures 314 can also be exposed at this time if the external connections for the die are to be on the top of wafer 308.) Mask 322 is then removed.

Figure 4A:
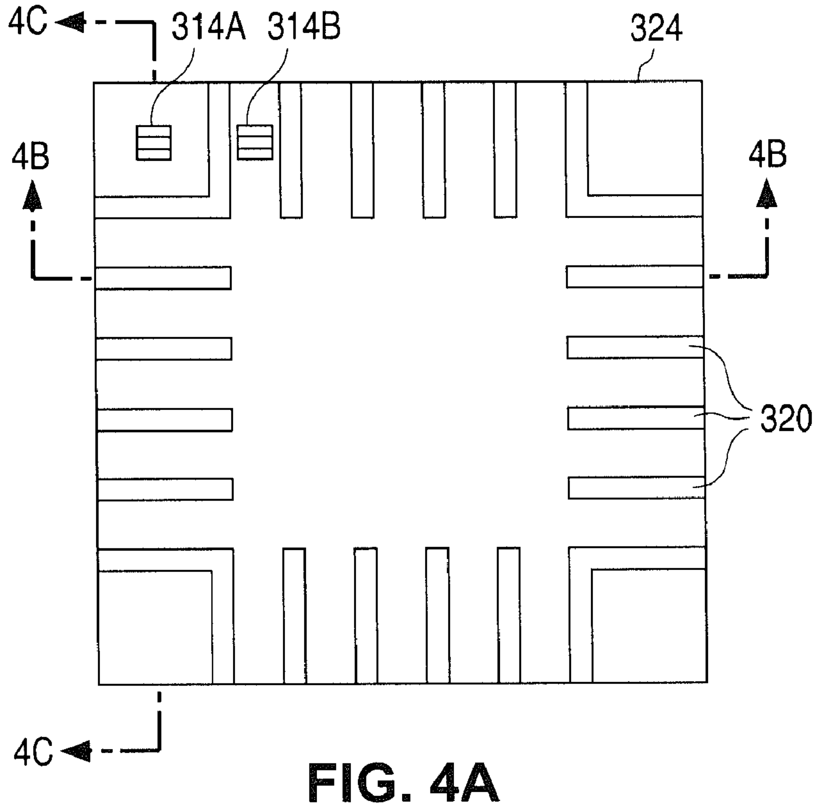
Figure 4B:
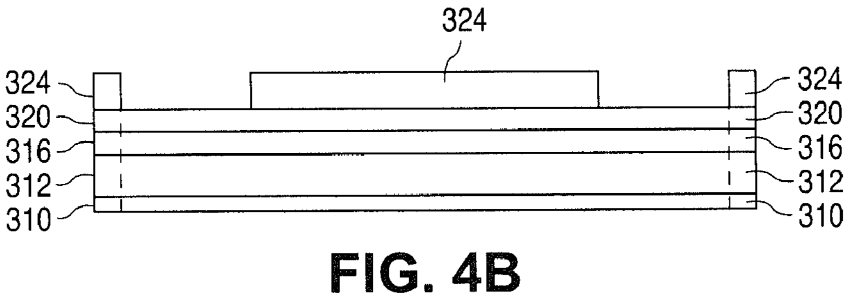
Figure 4C:
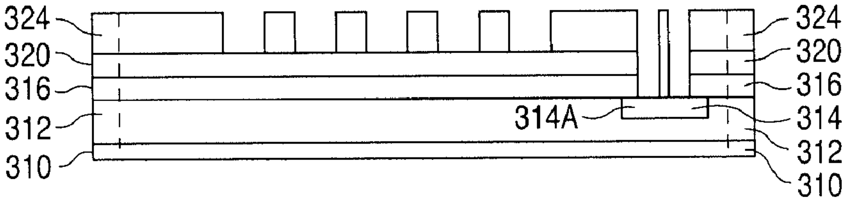

After mask 322 has been removed, as shown in FIGS. 4A-4C, a non-conductive mold 324 is formed on stress relief layer 320. Mold 324 can be formed, for example, by coating the exposed surfaces with 40 μm of SU-8 epoxy, followed by a soft bake at 95 C. for 10-15 minutes. After this, the soft bake epoxy is selectively exposed to ultraviolet light (365 nm) by a mask aligner to transfer a geometric pattern into the soft baked epoxy.

Following this, the soft baked epoxy is again baked, and then developed, such as by using immersion development at room temperature. After the development, the unexposed regions of the soft baked epoxy are rinsed away and removed. Once the unexposed regions of the soft baked epoxy have been removed, the developed epoxy is cured to form mold 324. As shown in FIGS. 4A and 4C, mold 324 includes multiple openings that expose the top surface of each conductive structure 314.

Figure 15:
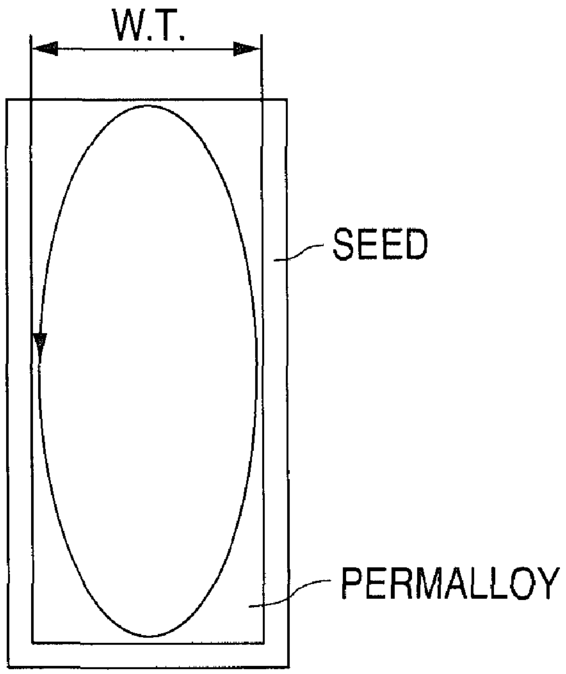
FIG. 15 is a cross-sectional drawing illustrating a traditional inductor magnetic core lamination of the type disclosed in above-cited U.S. application Ser. No. 12/082,209.

Referring to FIG. 15, above-cited related application Ser. No. 12/082,209 discloses a method of forming lower magnetic core laminations wherein the multiple openings formed in mold 324 are sized such that the openings pinch off during a subsequent copper plating process to form a more planar top surface. In the FIG. 15 cross-section of such a lamination, the direction of eddy current flow is determined by the direction of the magnetic field. From a fabrication standpoint, such a structure can be electroplated by a bottom-up approach, wherein the seed layer is deposited prior to spinning photoresist and, therefore, only exist at the bottom of the lamination. Alternately, a damascene electrochemical deposition (ECD) can be utilized that uses a seed layer that is sputtered over the patterned mold 324. Hence, magnetic material grows approximately uniformly from the bottom and the sidewalls. Once the sidewalls pinch off, the lamination structure shown in FIG. 1 has been formed.

Figure 16:
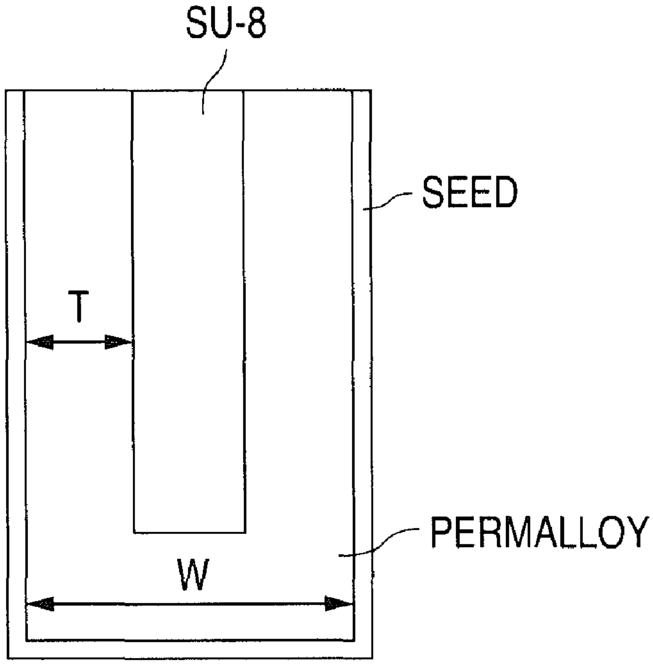
FIG. 16 is a cross-section of a controlled seam inductor magnetic core lamination in accordance with the concepts of the present invention.

In contrast, while the method of the present invention utilizes damascene ECD, the process stops prior to pinch off. That is, the controlled seam lamination includes a horizontal base and spaced-apart sidewalls that extend substantially vertically upward from the base. A cross-section of the resulting controlled seam lamination is shown in FIG. 16. As will be appreciated by those skilled in the art, the width of the seam in the middle of the lamination between the sidewalls can be controlled during the fabrication process. As can be seen in a comparison of FIGS. 15 and 16, the thickness T of the controlled seam lamination can be made smaller than the traditional FIG. 15 lamination at the expense of the increased overall width W of the lamination pattern if the same plating thickness is assumed Lower lamination thickness T means smaller eddy current losses inside the lamination.

Figure 5A:
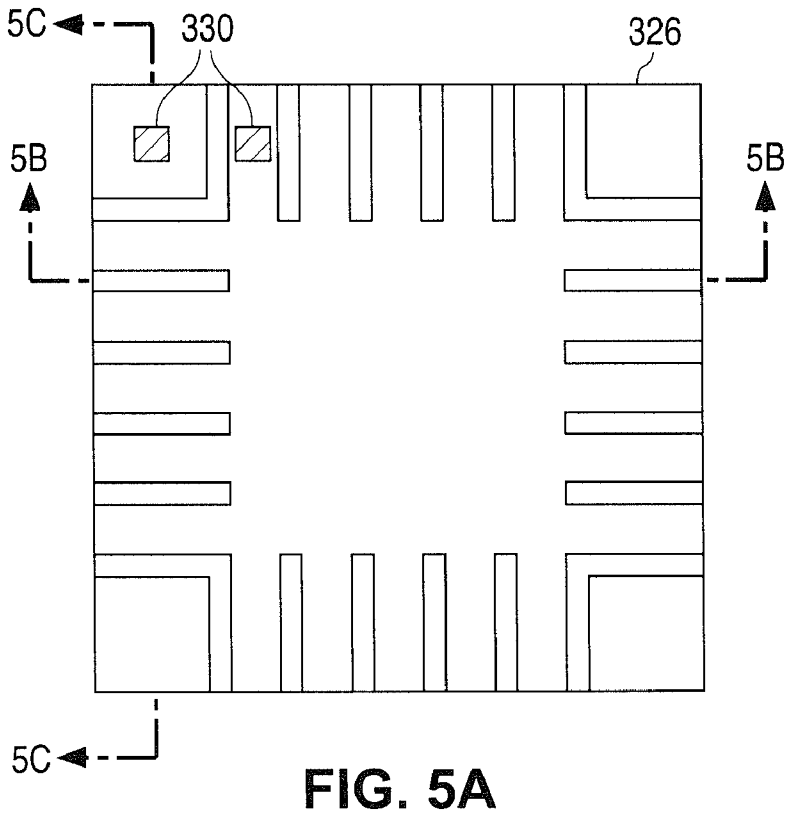
Figure 5B:
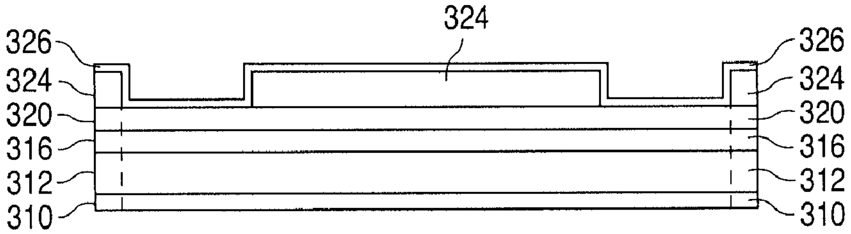
Figure 5C:
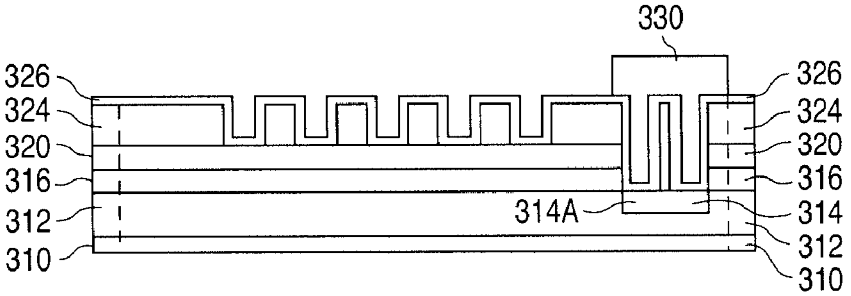

Thus, in accordance with the concepts of the present invention, as shown in FIGS. 5A-5C, after mold 324 has been formed, a copper seed layer 326 is formed on mold 324 and the top surfaces of the conductive structures 314. Copper seed layer 326 can be implemented utilizing, for example, 300 Å of titanium, 3000 Å of copper and 300 Å of titanium. The lower titanium layer enhances the adhesion between the aluminum and copper. A mask 330 is then formed and patterned on the copper seed layer 326. As shown in FIGS. 5A-5C, mask 330, which can be implemented with, for example, AZ or NR2 manufactured by Futurrex, covers and protects the top surfaces of the conductive structures 314.

Figure 6A:
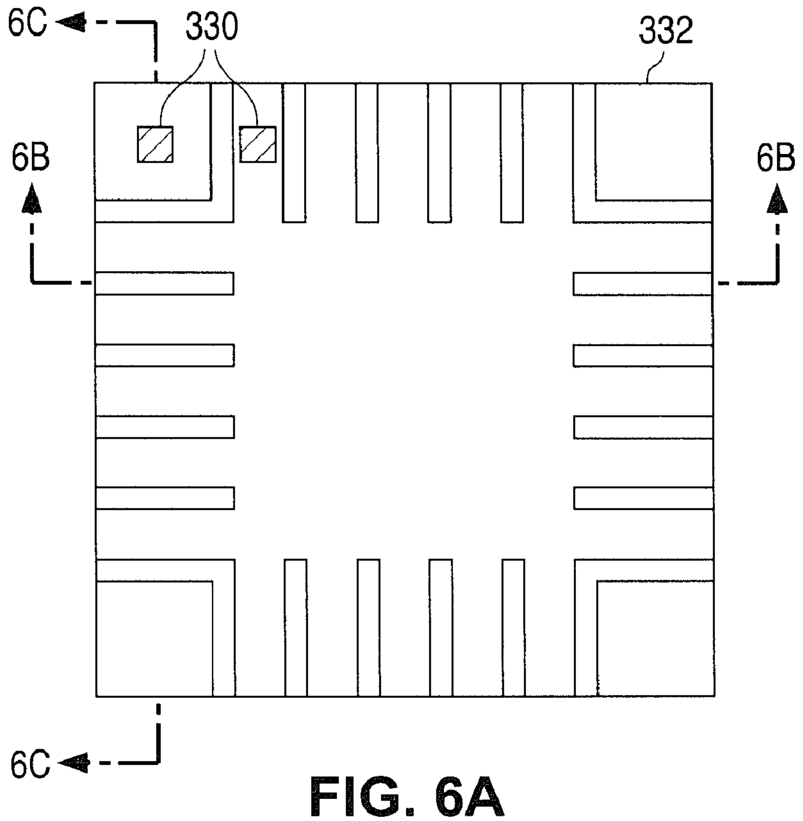
Figure 6B:
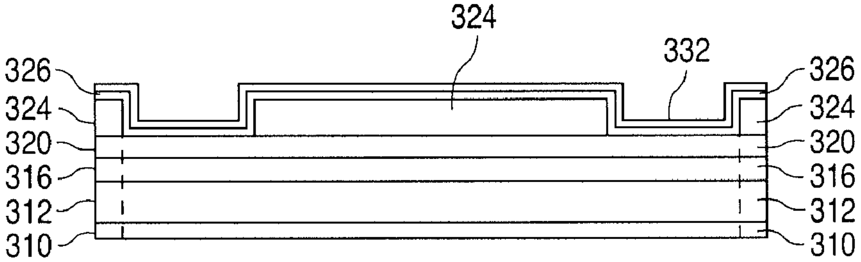
Figure 6C:
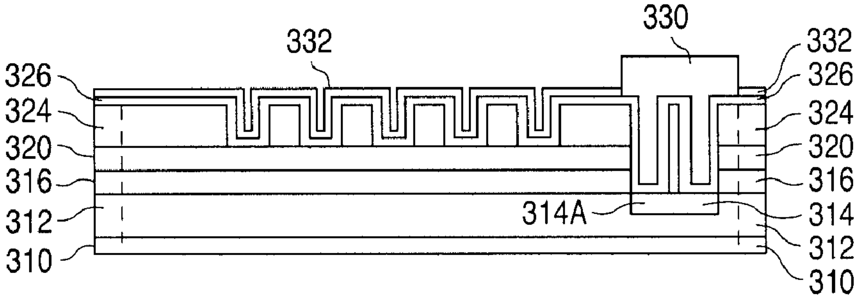

Following the formation of mask 330, as shown in FIGS. 6A-6C, the top titanium layer of seed layer 326 is removed. Permalloy (Ni—Fe) is then deposited by ECD and electroplated to form a magnetic region 332. (Other magnetic materials may alternately be used.)

Figure 7A:
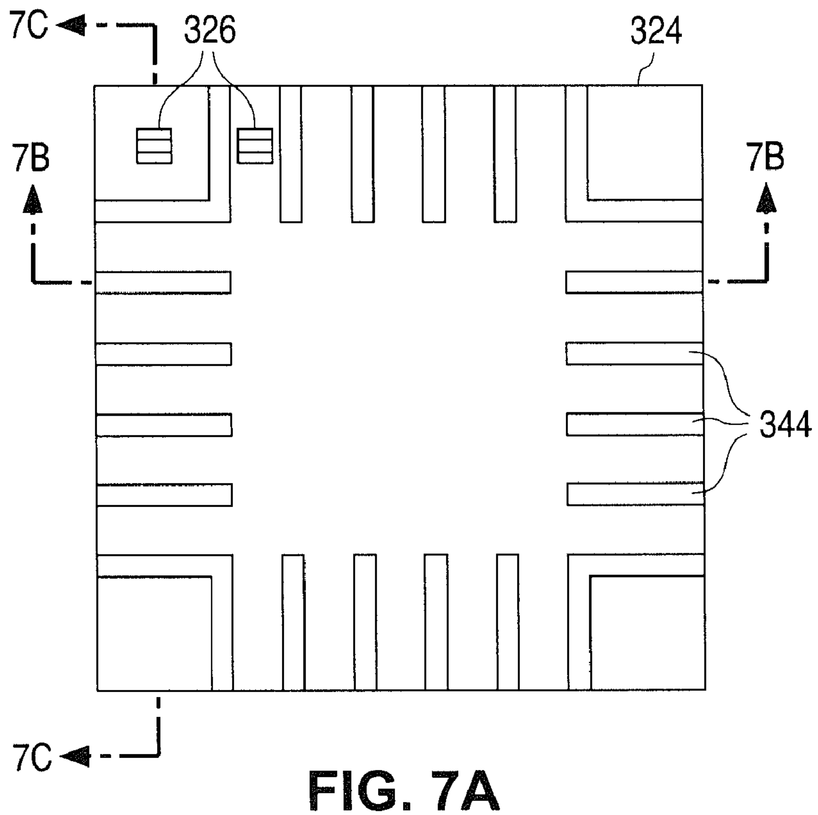
Figure 7B:
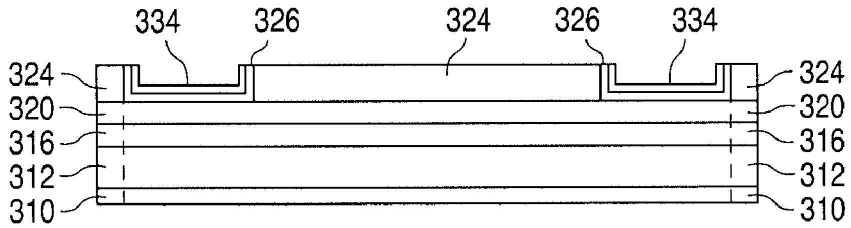
Figure 7C:
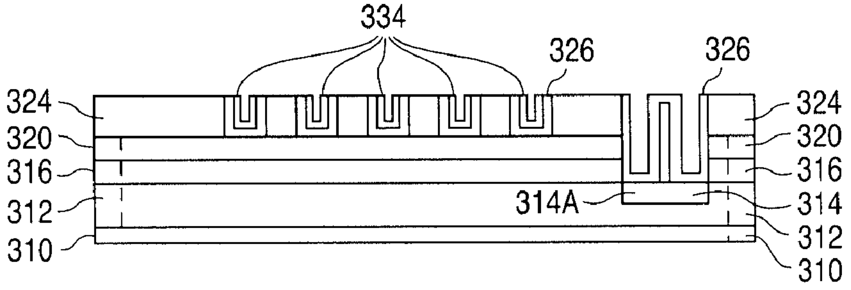

As shown in FIGS. 7A-7C, magnetic region 332 is then planarized until magnetic region 332 has been removed from the top surface of mold 324. The planarization forms a number of controlled seam magnetic lower laminations 334 of the type shown in FIG. 16 over each metal interconnect structure 312. Following the planarization, the remains of the mask 330 are removed and the structure is rinsed and cleaned.

Figure 8A:
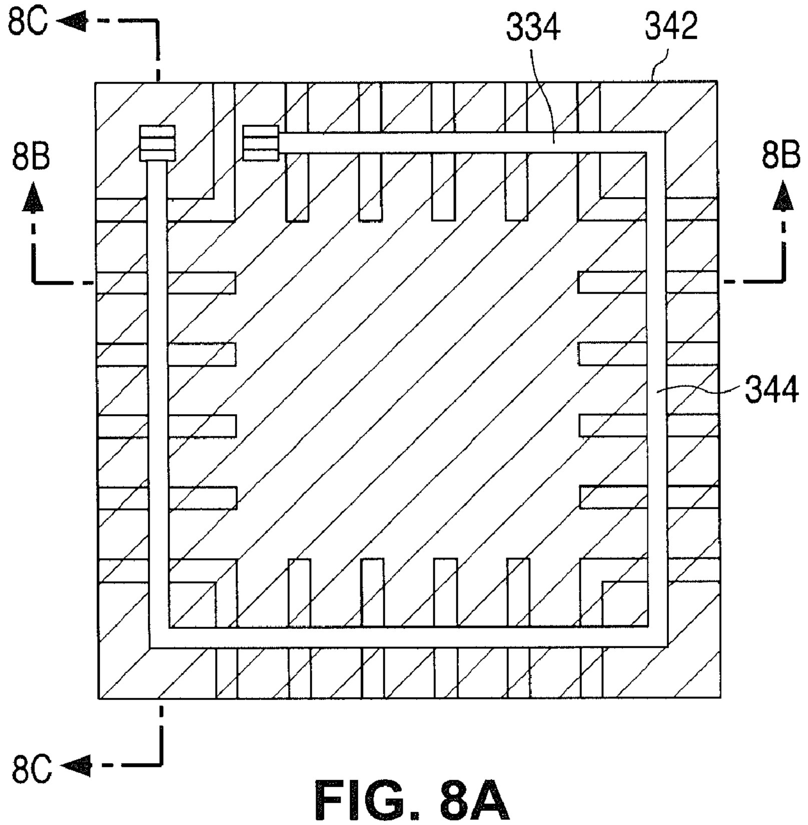
Figure 8B:
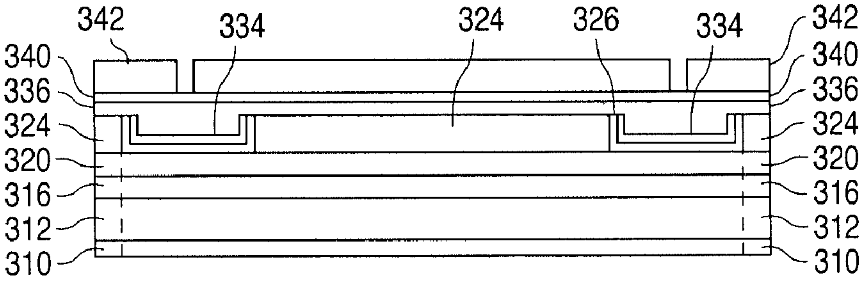
Figure 8C:
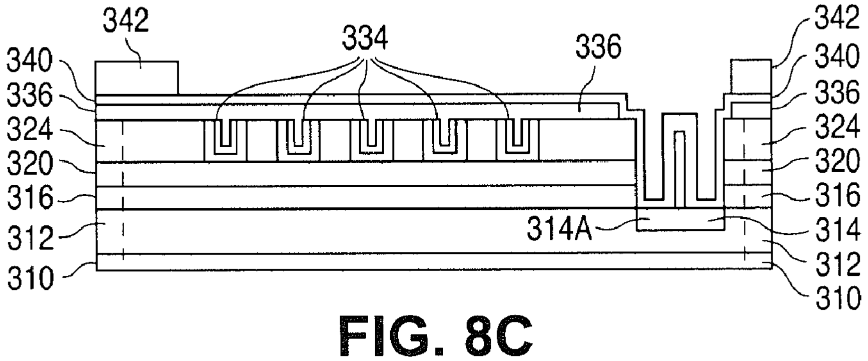

Next, as shown in FIGS. 8A-8C, a magnetic gap dielectric layer 336 approximately 1 μm thick is formed on mold 324 and on the controlled seam magnetic lower laminations 334 over each metal interconnect layer 312 to fill the seams in the controlled seam magnetic lower laminations 334. The magnetic gap dielectric layer 336 can be formed using, for example, SU-8 epoxy spun on to a thickness of approximately 1-3 μm. When using SU-8, dielectric layer 336 is formed in the same manner as mold 324, except that the various times (e.g., soft bake, exposure and development times) are a function of the thickness of the material. As shown in FIGS. 8B and 8C, no planarization is required.

After a magnetic gap dielectric layer 336 has been formed, a copper seed layer 340 is formed on magnetic gap dielectric layer 336 and copper seed layer 326. Copper seed layer 340 can be implemented utilizing, for example, 330 Å of titanium, 3000 Å of copper and 300 Å of titanium. After copper seed layer 340 has been formed, a non-conductive mold 342 is formed on copper seed layer 340. Mold 342 can be formed, for example, by forming and patterning a photoresist layer, such as AZ or NR2, to have a thickness of approximately 55 μm.

Figure 9A:
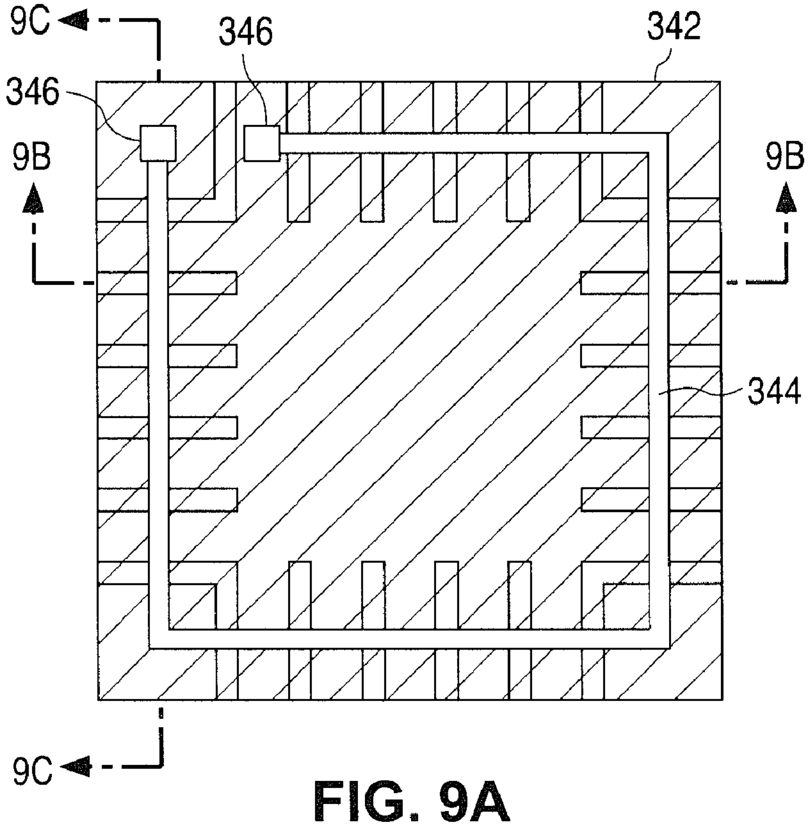
Figure 9B:
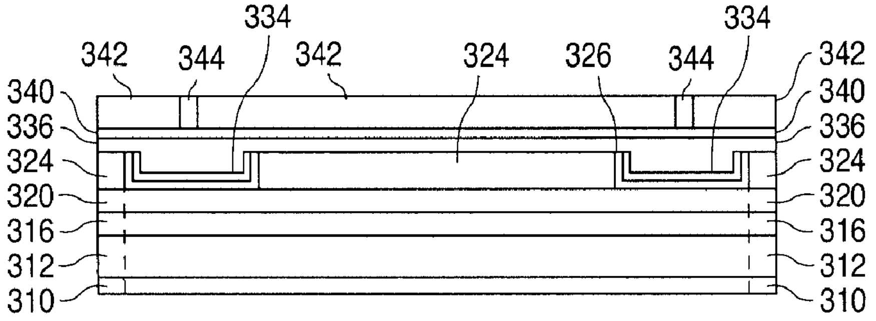
Figure 9C:
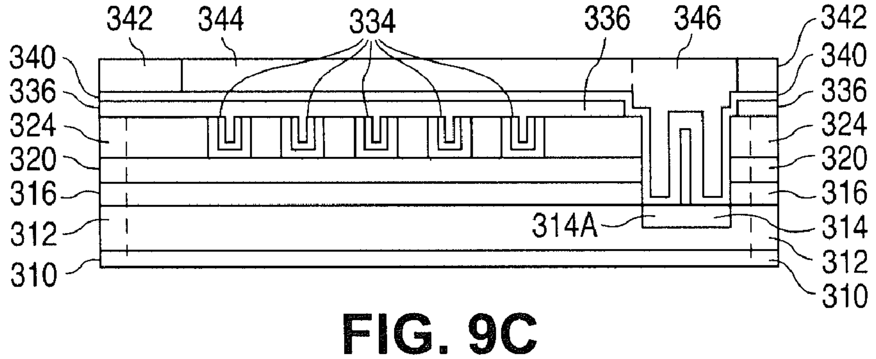

As shown in FIGS. 9A-9C, following formation of mold 342, the top titanium layer of seed layer 340 is removed. Copper is next deposited and electroplated to form a circular copper trace 344 and a pair of copper plugs 346 approximately 50 μm thick. (Nickel and gold can also be formed on the copper plugs 346 for wire bonding if needed.) In the disclosed embodiment, copper trace 344 is illustrated with a single loop, although those skilled in the art will appreciate that copper trace 344 can be formed to have multiple loops. Mold 342 is then removed, followed by removal of the exposed regions of the copper seed layer 340.

Figure 10A:
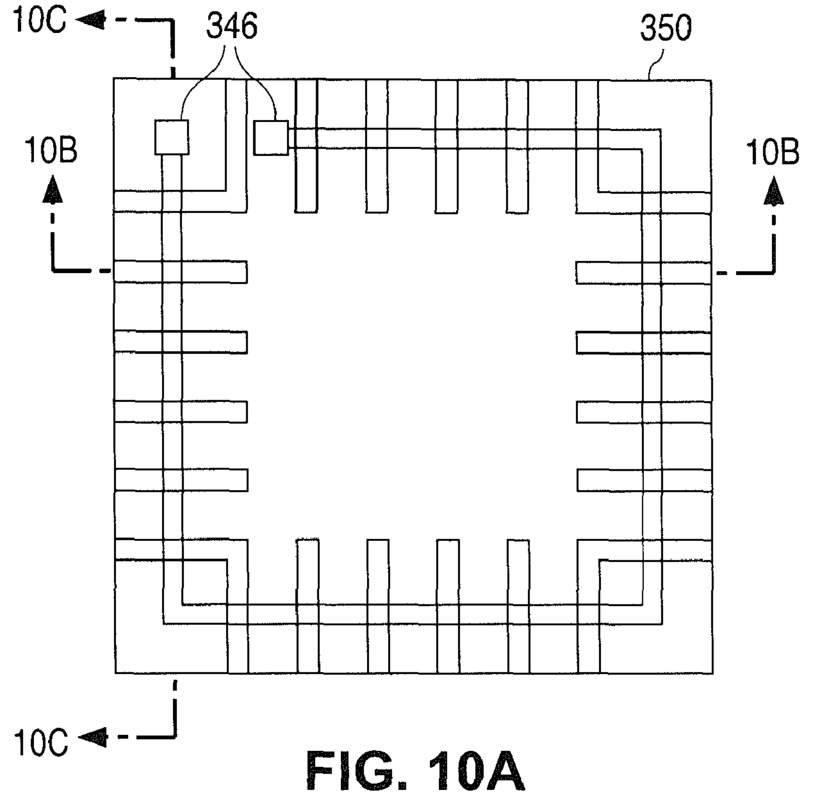
Figure 10B:
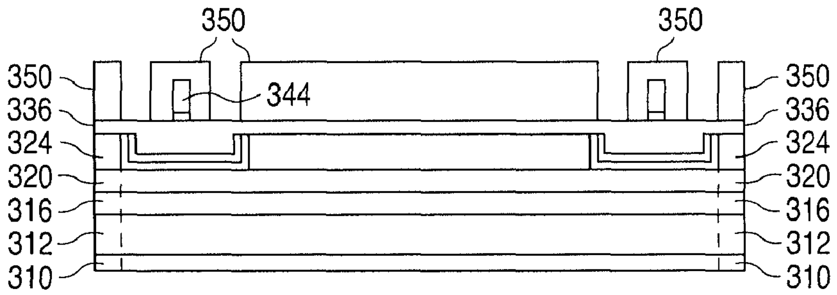
Figure 10C:
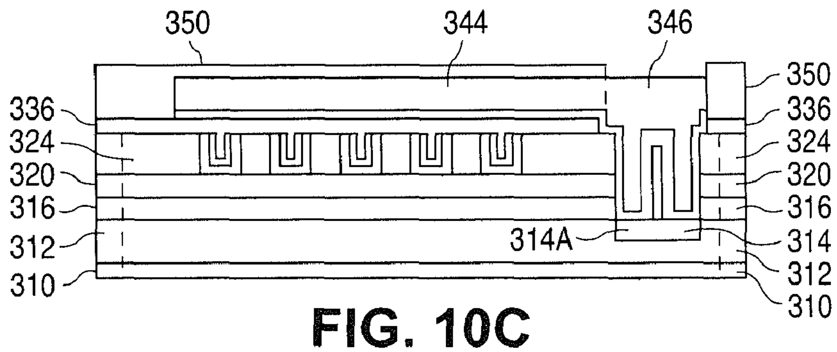

After mold 342 and the exposed regions of copper seed layer 340 have been removed, as shown in FIGS. 10A-10C, a non-conductive base mold 350 is formed on magnetic gap dielectric layer 336, circular copper trace 344 and the copper plugs 346. Base mold 350 can be formed to have a thickness of approximately 55 μm in the same manner as mold 324.

Figure 11A:
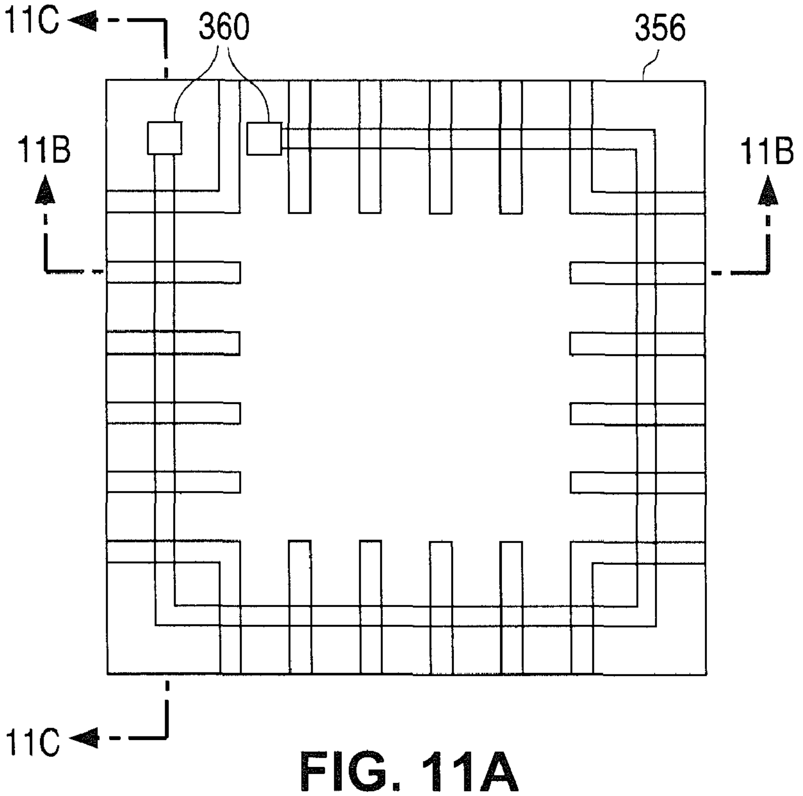
Figure 11B:
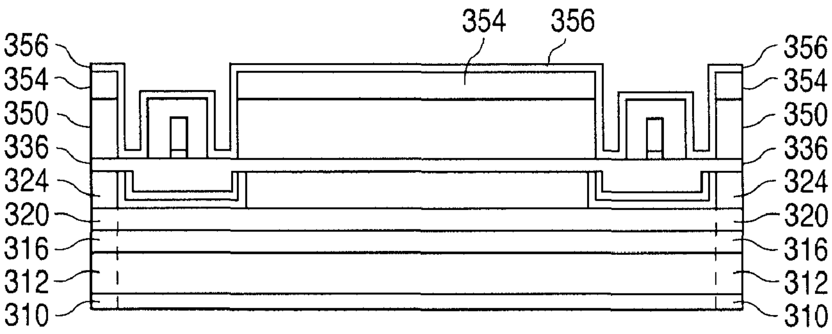
Figure 11C:
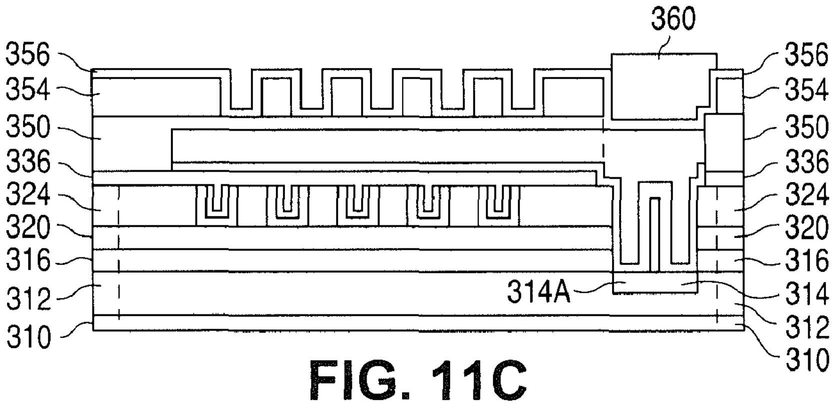

After base mold 350 has been formed, as show in FIGS. 11A-11C, a non-conductive cap mold 354 is formed on mold 350. (Alternately, rather than forming base mold 350 and cap mold 354, a single upper mold can be formed by using a variable transmission mask.) Mold 354 can be formed to have a thickness of approximately 35 μm in they same manner as mold 350. After mold 354 has been formed, a copper seed layer 356 is formed on the copper plugs 346 and the exposed regions of molds 350 and 354. Copper seed layer can be implemented utilizing, for example, 300 Å of titanium, 3000 Å of copper and 300 Å of titanium. A mask 360 is then formed and patterned on copper seed layer 356. As shown FIGS. 11A-11C, mask 360 covers and protects the copper seed layer 356 that lies over the copper plugs 346. (Mold 354 exposes the top surfaces of the copper plugs 346 of the inductor, but need not expose the top surfaces of the copper plugs of the inductor if no wire bonding to the top surfaces of the copper plugs 346 is to occur.)

Figure 12A:
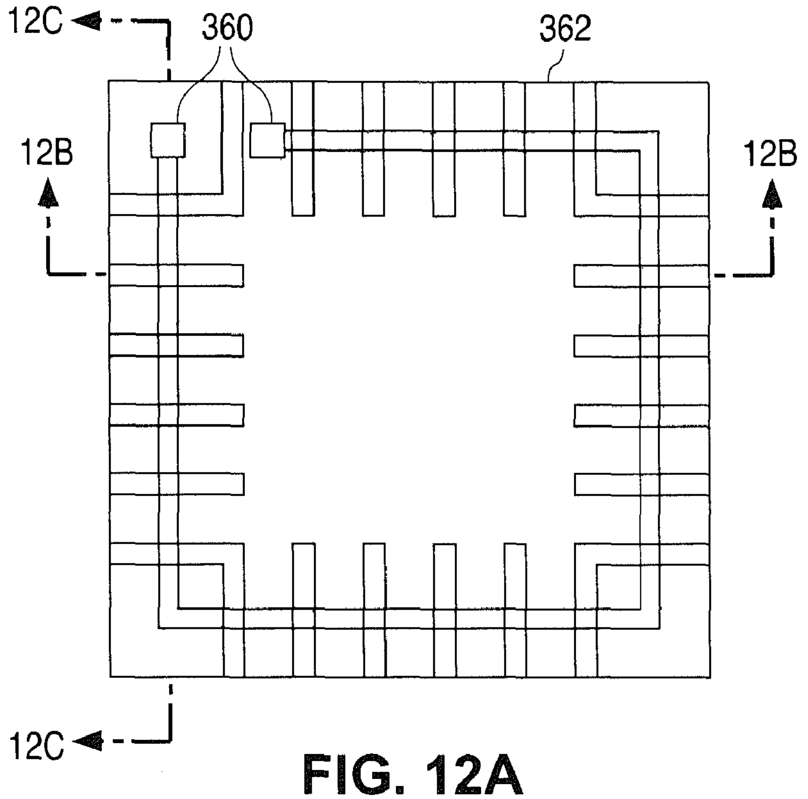
Figure 12B:
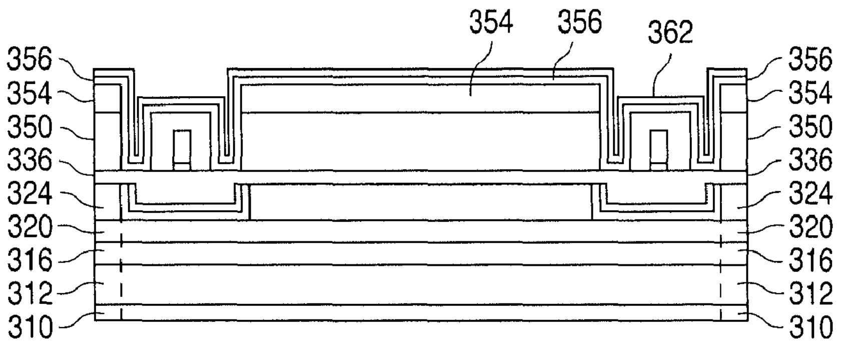
Figure 12C:
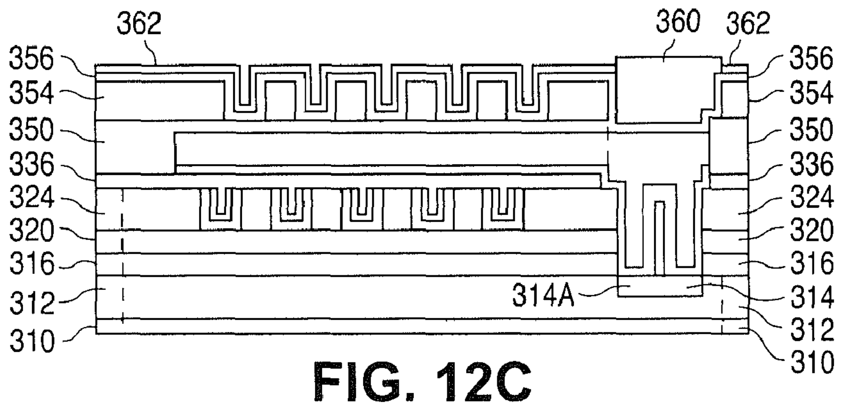

As shown in FIGS. 12A-12C, following the formation of mask 360, the top titanium layer of seed layer 356 is removed. Then, in a manner similar to that described above with respect to the formation of the controlled seam magnetic upper laminations 334, Permalloy (Ni—Fe) is then deposited and electroplated to form a magnetic region 362. (Other magnetic materials may alternately be used.)

Figure 13A:
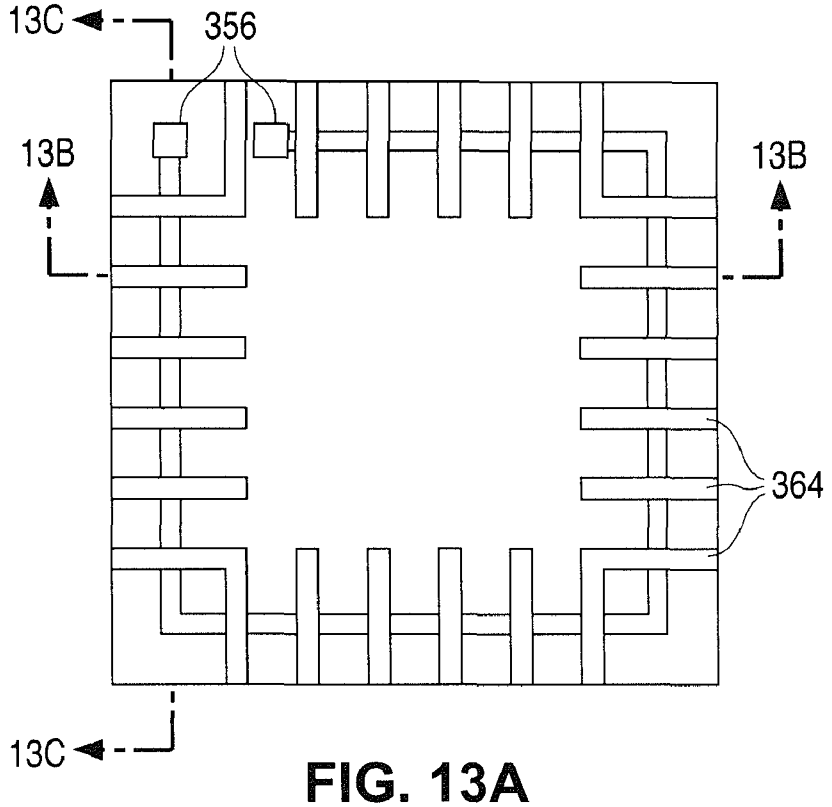
Figure 13B:
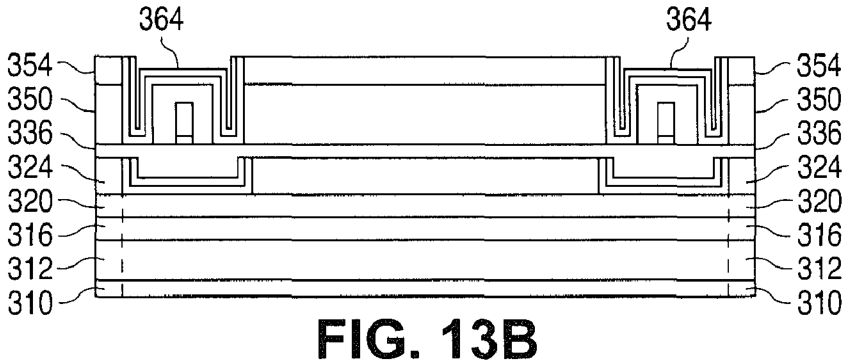
Figure 13C:
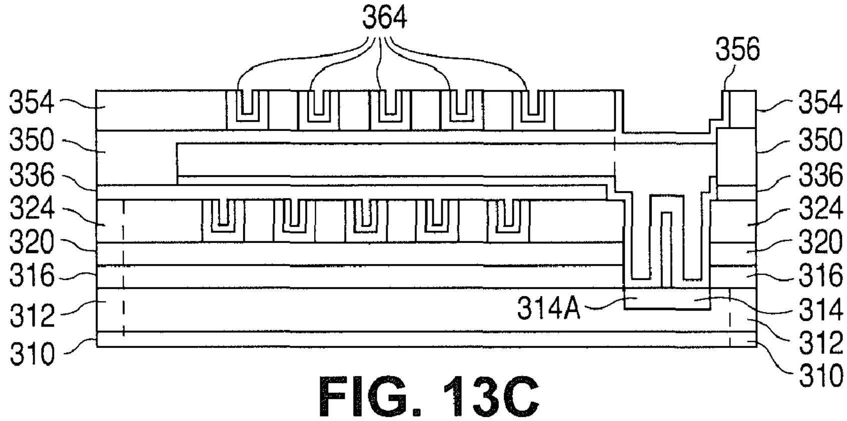

Next, as shown in FIGS. 13A-13C, magnetic region 362 is planarized until magnetic region 362 has been removed from the top surface of mold 354. The planarization forms a number of controlled seam magnetic upper laminations 364 of the type shown in FIG. 16 with via extensions over each metal interconnect structure 312. Following the planarization, the remains of mask 360 are removed and the structure is rinsed and cleaned.

Figure 14A:
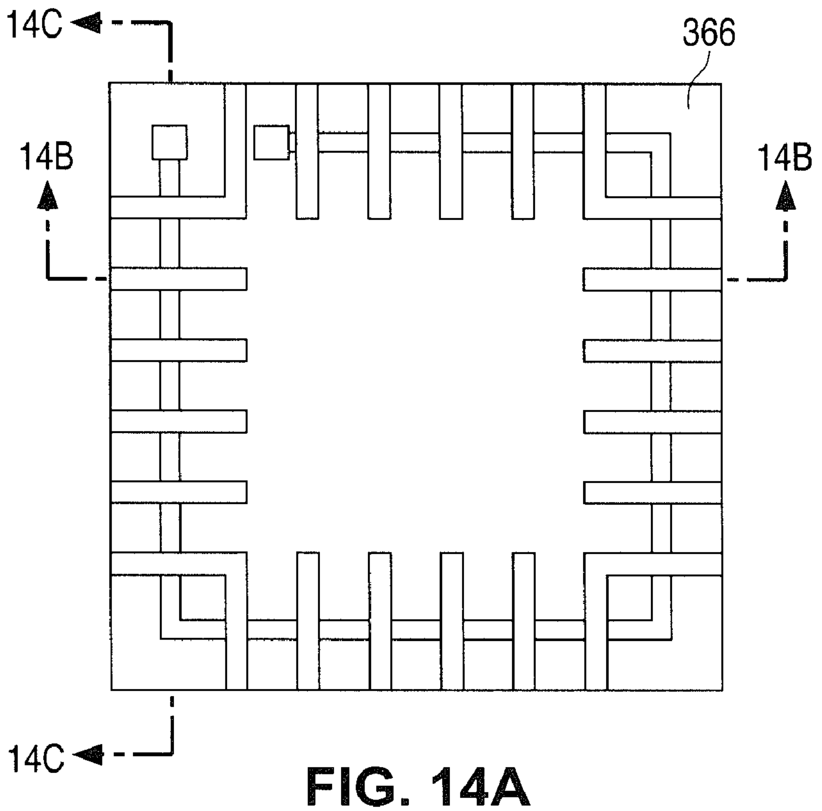
Figure 14B:
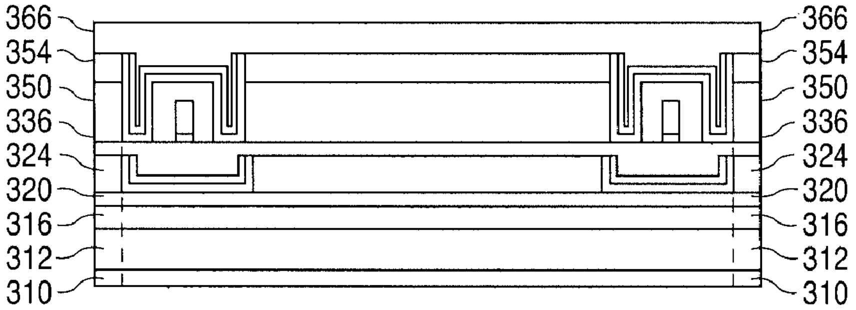
Figure 14C:
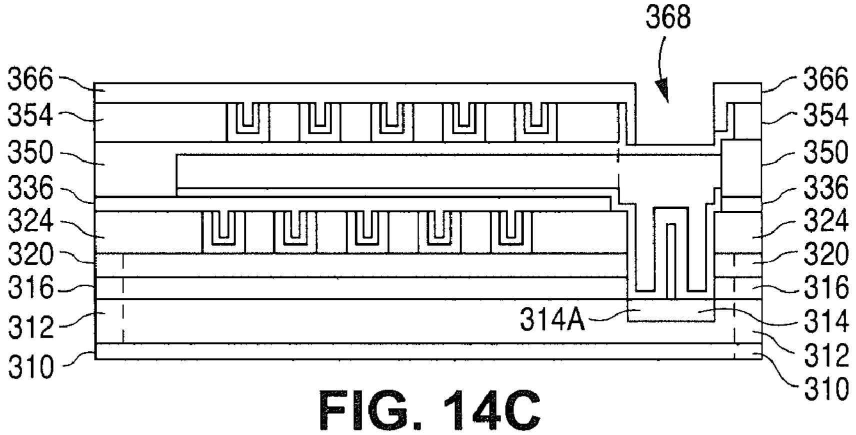

Next, as shown in FIGS. 14A-14C, a passivation layer 366 is formed on mold 354 and the controlled seam magnetic upper laminations 364. Passivation layer 366 can be implemented utilizing, for example, benzocyclobutene (BCB) or SU-8 epoxy. Openings 368 are then formed in the passivation layer 366 to expose the copper seed layer that lies over the copper plugs 346.

Figure 17:
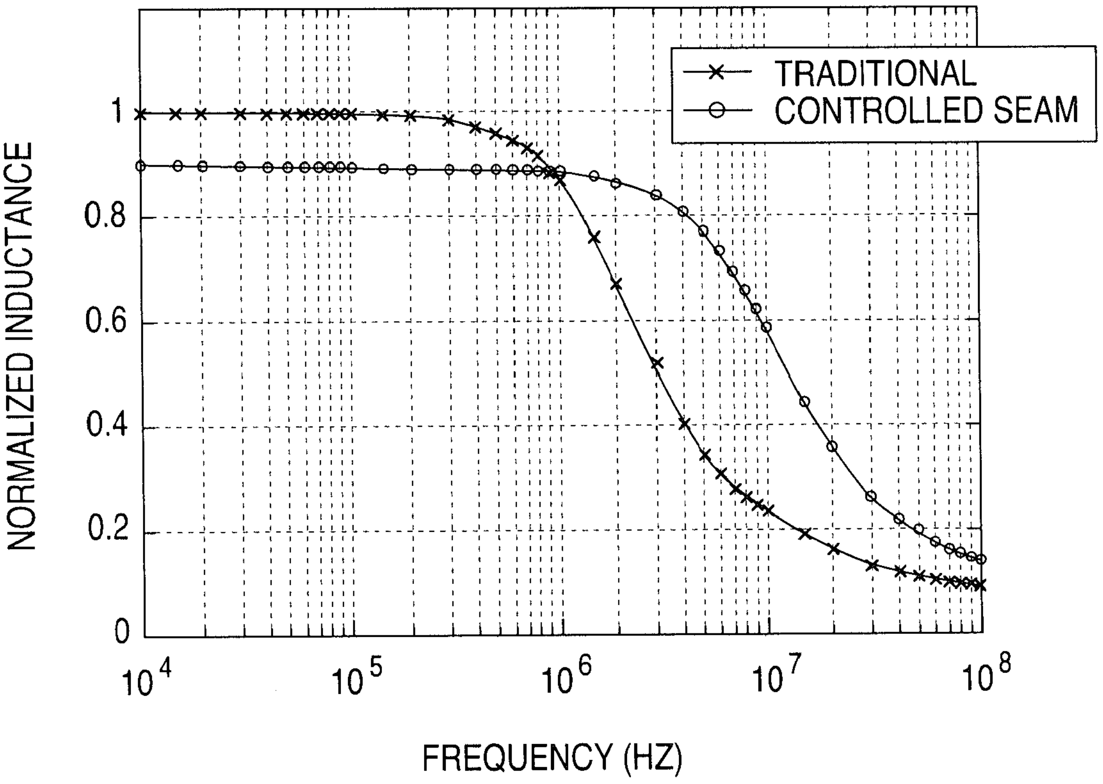
FIG. 17 is a graph illustrating a modeled comparison of the small signal AC characteristic for the traditional FIG. 15 magnetic core lamination and the FIG. 16 controlled seam magnetic core lamination in accordance with the concepts of the present invention.

FIG. 17 shows a modeled comparison of the small signal AC characteristics for an inductor that utilizes the FIG. 15 traditional magnetic core lamination design and for an inductor that utilizes the FIG. 16 controlled seam magnetic core lamination design in accordance with the present invention, as applied to the same spiral inductor design with NiFe 80:20. As can be seen from FIG. 17, about a 10% drop in the low frequency inductance value can result in a several MHz extension in frequency range.

It should be understood that the above describes exemplary embodiments of the present invention and that various alternatives of the embodiments described herein may be employed in practicing the invention. Therefore, it is intended that the following claims define the scope of the invention and that structures and methods within the scope of these claims and their equivalents be covered thereby.

What is claimed is:

1. A controlled seam magnetic core lamination utilizable in an inductor structure, the controlled seam magnetic core lamination comprising:

a magnetic base, having top and bottom surfaces and first and second ends;

first and second spaced-apart magnetic sidewalls extending substantially orthogonally and parallel from the base, each magnetic sidewall having a top surface and a bottom surface, wherein the bottom surface of the first magnetic sidewall touches the top surface of the first end of the magnetic base and the bottom surface of the second magnetic sidewall touches the top surface of the second end of the magnetic base, forming a continuous path of magnetic material from the top surface of the first magnetic sidewall, through the magnetic base, to the top surface of the second magnetic sidewall; and a non-conductive and non-magnetic seam material formed to touch the top surface of the magnetic base and substantially filling the space between the first and second spaced-apart magnetic sidewalls.

2. The controlled seam magnetic core lamination of claim 1, wherein the magnetic material comprises NiFe.

3. The controlled seam magnetic core lamination of claim 1, wherein the non-conductive and non-magnetic seam material comprises SU-8 epoxy.

4. An inductor structure comprising:

a non-nonconductive lower mold;

a plurality of spaced-apart controlled seam magnetic lower laminations formed in the lower mold, each magnetic lower lamination having a horizontal base and first and second spaced-apart sidewalls, each spaced-apart sidewall having a top surface, extending substantially vertically and parallel upward from the base to define a a continuous path of magnetic material from the top surface of the first magnetic sidewall, through the magnetic base, to the top surface of the second magnetic sidewall; a non-conductive and non-magnetic seam material, touching the base and substantially filling the space between the spaced-apart sidewalls;

a non-conductive isolation layer formed on the lower mold and the controlled seam magnetic lower laminations;

a conductive trace formed on the isolation layer;

a non-conductive upper mold formed over the isolation layer and the conductive trace; and a plurality of spaced-apart controlled seam magnetic lower laminations formed in the upper mold, each magnetic lower lamination having a horizontal base and first and second spaced-apart sidewalls, each spaced-apart sidewall having a top surface, extending substantially vertically and parallel upward from the base to define a a continuous path of magnetic material from the top surface of the first magnetic sidewall, through the magnetic base, to the top surface of the second magnetic sidewall; a non-conductive and non-magnetic seam material, touching the base and substantially filling the space between the spaced-apart sidewalls.

5. The inductor structure of claim 4, wherein the controlled seam magnetic lower laminations and the controlled seam magnetic upper laminations comprise NiFe.

6. The inductor structure of claim 4, wherein the isolation layer comprises SU-8 epoxy.

7. The inductor structure of claim 4, wherein the upper non-conductive mold layer comprises SU-8 epoxy.

8. The inductor structure of claim 4, wherein the conductive trace comprises copper.

9. The inductor structure of claim 4, wherein conductive trace comprises multiple loops.

* * * * *